(12) United States Patent
Hetzel et al.

(10) Patent No.: US 7,472,366 B1
(45) Date of Patent: Dec. 30, 2008

(54) METHOD AND APPARATUS FOR PERFORMING A PATH SEARCH

(75) Inventors: Asmus Hetzel, Berlin (DE); Etienne Jacques, Aix-en-Provence (FR)

(73) Assignee: Cadence Design Systems, Inc., San Jose, CA (US)

( * ) Notice: Subject to any disclaimer, the term of this patent is extended or adjusted under 35 U.S.C. 154(b) by 94 days.

(21) Appl. No.: 11/195,335

(22) Filed: Aug. 1, 2005

(51) Int. Cl.
*G06F 17/50* (2006.01)

(52) U.S. Cl. .............................. 716/13; 716/12; 716/14; 716/15

(58) Field of Classification Search ............... 716/12–15
See application file for complete search history.

(56) References Cited

U.S. PATENT DOCUMENTS

| | | | |
|---|---|---|---|
| 5,822,214 A | 10/1998 | Rostoker et al. | |
| 6,256,769 B1 | 7/2001 | Tamarkin et al. | |
| 6,490,713 B2 * | 12/2002 | Matsumoto | 716/12 |
| 6,609,237 B1 * | 8/2003 | Hamawaki et al. | 716/10 |
| 6,645,842 B2 * | 11/2003 | Igarashi et al. | 438/598 |
| 6,678,876 B2 | 1/2004 | Stevens et al. | |
| 6,763,508 B2 * | 7/2004 | Igarashi et al. | 716/8 |
| 6,802,048 B2 | 10/2004 | Goto et al. | |
| 6,879,934 B1 | 4/2005 | Teig | |
| 6,938,230 B2 | 8/2005 | Frank et al. | |
| 6,976,237 B1 | 12/2005 | Teig | |
| 6,996,793 B1 | 2/2006 | Kronmiller et al. | |
| 7,002,572 B1 | 2/2006 | Teig | |
| 7,065,731 B2 | 6/2006 | Jacques et al. | |
| 7,174,529 B1 | 2/2007 | Hetzel | |
| 2003/0126582 A1 | 7/2003 | Kobayashi et al. | |
| 2003/0192019 A1 | 10/2003 | Goto et al. | |
| 2004/0098697 A1 | 5/2004 | Frankle et al. | |
| 2004/0225990 A1 | 11/2004 | Jacques et al. | |
| 2005/0172247 A1 | 8/2005 | Papadopoulou et al. | |
| 2005/0223348 A1 | 10/2005 | Frank et al. | |
| 2005/0273744 A1 | 12/2005 | Allen et al. | |

OTHER PUBLICATIONS

Non-Final Office Action of U.S. Appl. No. 10/779,954, Mar. 31, 2006 (mailing date), Hetzel, Asmus G., now issued U.S. Patent 7,174,529.
Notice of Allowance of U.S. Appl. No. 10/779,954, Sep. 27, 2006 (mailing date), Hetzel, Asmus G., now issued U.S. Patent 7,174,529.
NB8911253, "Polygonal Expansion Algorithm", Nov. 1, 1989, vol. No. 32, Issue No. 6B, pp. 253-264.

* cited by examiner

*Primary Examiner*—Thuan Do
*Assistant Examiner*—Nghia M Doan
(74) *Attorney, Agent, or Firm*—Adeli & Tollen LLP

(57) ABSTRACT

Some embodiments of the invention provide a routing method. The routing method receives a set of nets to route in a region of an integrated circuit ("IC") layout. The routing method defines routes for the nets in a manner that ensures that each segment of each route is not less than a minimum length that is required for the segment. In some embodiments, the routing method identifies a route for a net by performing one or more path search operations. Each path search operation identifies one set of path expansions that can be used to define a segment of a route for the net. A path search operation in some embodiments performs a viability check for each path expansion that it identifies, in order to ensure that any segment that might eventually result from an identified set of path expansions satisfies its minimum required length.

22 Claims, 16 Drawing Sheets

| Start Geometry | Interconnect Line | Destination Geometry | Minimum Length of the Connecting Path Expansion |
|---|---|---|---|
| Horizontal Manhattan | 45 degree | Horizontal Manhattan | a |
| Horizontal Manhattan | 135 degree | Horizontal Manhattan | b |
| Horizontal Manhattan | Horizontal Manhattan | Horizontal Manhattan | Not applicable |
| Horizontal Manhattan | 45 degree | Type A Pin | a |
| Type X Via | 135 degree | Type B Pin | c |
| Type y Via | 135 degree | Horizontal Manhattan | d |
| Type Z Via | 135 degree | Vertical Manhattan | e |
| Type A Pin | 135 degree | Type Y Via | f |
| ⋮ | ⋮ | ⋮ | ⋮ |

Figure 9

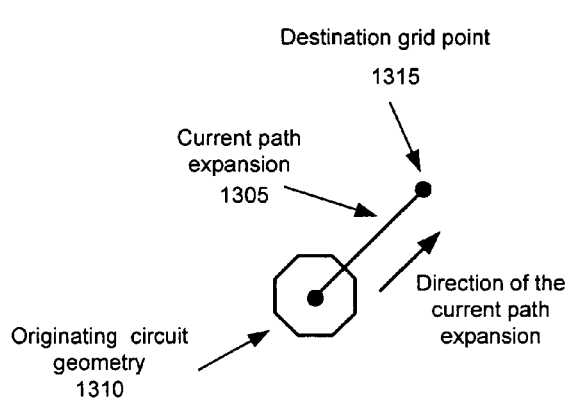

Destination grid point
1315

Current path expansion
1305

Direction of the current path expansion

Originating circuit geometry
1310

Current Action:
Originate a path expansion from a circuit geometry

Connection Rule to Check:
Is the direction of the expansion an available direction for the originating circuit geometry?

Minimum Edge Length Rule to Check:
None

Parameters to save:
If the expansion does not violate any rules, save the direction and the length of the path expansion

Figure 13

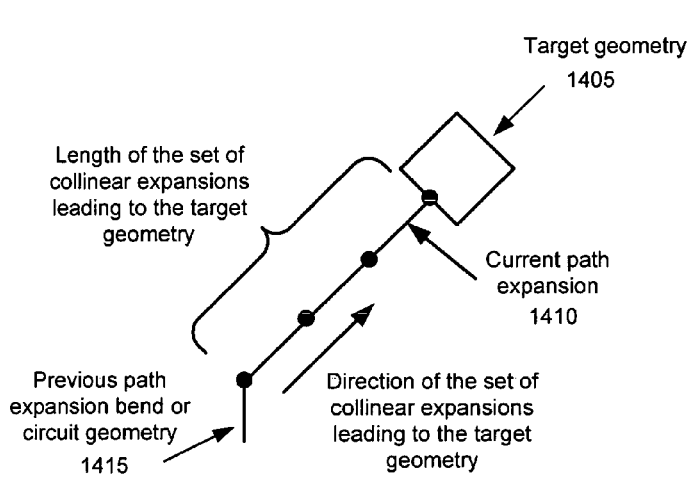

Target geometry
1405

Length of the set of collinear expansions leading to the target geometry

Current path expansion
1410

Previous path expansion bend or circuit geometry
1415

Direction of the set of collinear expansions leading to the target geometry

Current Action:
Add a path expansion that terminates on the target geometry

Connection Rule to Check:
Is the direction of the path expansion an available direction for the target geometry?

Minimum Edge Length Rule to Check:
Does the length of the set of collinear expansions leading to the target geometry violate minimum edge length rule?

Parameters to save:
Since the path expansion has reached the destination, there is no need to save any parameters specific to the min edge length rule

Figure 14

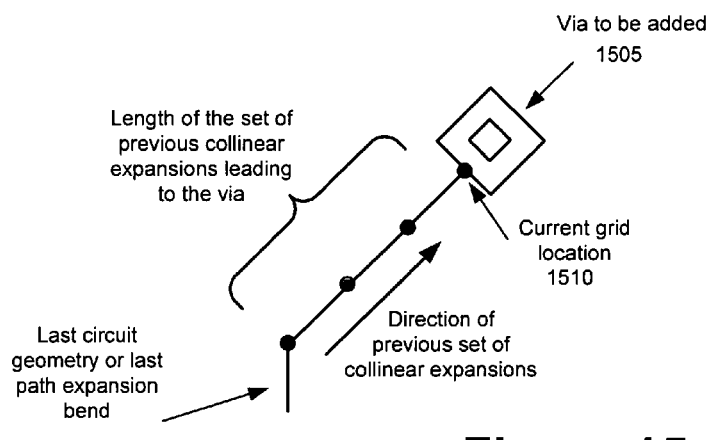

Figure 15

Current Action:
Add a new via to the end of an existing expansion

Connection Rule to Check:
Is the direction of previous expansion an available direction for the selected via shape?

Minimum Edge Length Rule to Check:
Does the length of the set of previous collinear expansions leading to the via geometry violate minimum edge length rule?

Parameters to be saved:
If the via is allowed, save the via shape

US 7,472,366 B1

METHOD AND APPARATUS FOR PERFORMING A PATH SEARCH

FIELD OF THE INVENTION

The present invention is directed towards method and apparatus for routing.

BACKGROUND OF THE INVENTION

An integrated circuit ("IC") is a device (e.g., a semiconductor device) that includes many electronic components, such as transistors, resistors, diodes, etc. These components are often interconnected to form multiple circuit components, such as gates, cells, memory units, arithmetic units, controllers, decoders, etc. An IC includes multiple layers of wiring that interconnect its electronic and circuit components. Traditionally, IC's use preferred direction ("PD") wiring models, which specify a preferred wiring direction for each of their wiring layers. In preferred direction wiring models, the preferred direction typically alternates between successive wiring layers. One example of a PD wiring model is the PD Manhattan wiring model, which specifies alternating layers of preferred-direction horizontal and vertical wiring.

Design engineers design IC's by transforming logical or circuit descriptions of the IC's into geometric descriptions, called layouts. IC layouts typically include (1) circuit modules (i.e., geometric representations of electronic or circuit IC components) with pins, and (2) interconnect lines (i.e., geometric representations of wiring) that connect the pins of the circuit modules. A net is typically defined as a collection of pins that need to be connected. A list of all or some of the nets in a layout is referred to as a net list.

To create layouts, design engineers typically use electronic design automation ("EDA") applications. These applications provide sets of computer-based tools for creating, editing, and analyzing IC design layouts. One EDA tool is a router that defines routes for interconnect lines that typically connect the pins of nets. While some commercial routers today might allow an occasional diagonal jog, these routers do not typically explore diagonal routing directions consistently when they are specifying the routing geometries of the interconnect lines. This, in turn, increases the total wirelength (i.e., total length of interconnect lines) needed to connect the nets in the layout.

There are certain techniques during manufacturing that require certain geometries have a minimum length. FIG. 1 conceptually illustrates a portion of an IC layout design 100 consisting of a pin 105, a via 110 (vias are further described in Section I below), an interconnect line 115 connecting the pin 105 and the via 110, and another interconnect line 120 in the same layer connecting the via 110 to other circuit geometries. Ideally, after the manufacturing process, the corresponding fabricated portion of the IC must look like a single piece of metal 125 with the same outline as the original IC layout design 100.

In order to generate a pattern such as 125 on an IC wafer, some IC fabrication processes use a photomask and a visible or ultraviolet light source. The wafer surface is covered by a layer of either electrically insulating or electrically conductive material. This material is then coated with a photosensitive resist. The light source is then used to project the image on the photomask onto the wafer. The resist is then developed in a developer solution after its exposure to light to produce patterns that define which areas of the wafer are exposed for material deposition or removal.

In practice, in order to make the fabricated pattern 125 to look as close as the original IC layout design 100, certain techniques such as Optical Proximity Correction (OPC) are utilized that would require some geometries on the IC surface to have a minimum length. For instance, the OPC technique improves the IC yield by applying systematic changes to the photomask geometries to compensate for nonlinear distortions caused by optical diffraction and resist process effects. OPC makes small changes to the IC layout that anticipate the distortion. Small shapes may be added or subtracted from corners to produce corners in the fabricated IC that are closer to the ideal layout. As a result, certain edges in the IC design layout have to have a minimum length for OPC or similar processes to work properly. There is, therefore, a need in the art for a technique to ensure a minimum length for certain edges and interconnects lines during the routing process.

SUMMARY OF THE INVENTION

Some embodiments of the invention provide a routing method. The routing method receives a set of nets to route in a region of an integrated circuit ("IC") layout. The routing method defines routes for the nets in a manner that ensures that each segment of each route is not less than a minimum length that is required for the segment.

Each route segment is along a particular direction. In some embodiments, at least one route has at least one segment in a Manhattan direction and one segment in a non-Manhattan diagonal direction. In some embodiments, the segment in the Manhattan direction can be on the same layer as the segment in the non-Manhattan diagonal direction, or on a different layer as the segment in the non-Manhattan diagonal direction.

In some embodiments, the routing method identifies a route for a net by performing one or more path search operations, where each path search operation identifies one set of path expansions that can be used to define a segment of a route for the net. A path search operation in some embodiments performs a viability check for each path expansion that it identifies, in order to ensure that any segment that might eventually result from an identified set of path expansions satisfies its minimum required length.

The routing method of some embodiments defines routes for a set of received nets in a multi-layer IC layout. This method defines the routes in a manner that ensures that each segment of each route that connects to a routable element or via (where a via is an element of a route that is used to direct the route from one layer to another) is along a direction that is available for connecting to the routable element or via.

In some embodiments, the minimum length requirements and the available connection directions for all possible combination of route segments, routable elements, and vias is pre-tabulated offline. These pre-tabulated requirements and connection rules are then accesses by the router during a routing operation to speed up the routing operation.

BRIEF DESCRIPTION OF THE DRAWINGS

The novel features of the invention are set forth in the appended claims. However, for purpose of explanation, several embodiments of the invention are set forth in the following figures.

FIG. 4 illustrates five routing grids for the five-layer wiring model of FIG. 2.

FIG. 9 conceptually illustrates a pre-tabulated rule table for minimum length of the middle interconnect line in three segment structures.

FIG. 13 illustrates a path expansion originating from a circuit geometry.

FIG. 14 illustrates a path expansion terminating to the target geometry.

FIG. 15 illustrates adding a via to the end of a path expansion.

DETAILED DESCRIPTION OF THE INVENTION

In the following description, numerous details are set forth for purpose of explanation. However, one of ordinary skill in the art will realize that the invention may be practiced without the use of these specific details. In other instances, well-known structures and devices are shown in block diagram form in order not to obscure the description of the invention with unnecessary detail.

Some embodiments of the invention provide a routing method. The routing method receives a set of nets to route in a region of an integrated circuit ("IC") layout. The routing method defines routes for the nets in a manner that ensures that each segment of each route is not less than a minimum length that is required for the segment.

Each route segment is along a particular direction. In some embodiments, at least one route has at least one segment in a Manhattan direction and one segment in a non-Manhattan diagonal direction. In some embodiments, the segment in the Manhattan direction can be on the same layer as the segment in the non-Manhattan diagonal direction, or on a different layer as the segment in the non-Manhattan diagonal direction.

In some embodiments, the routing method identifies a route for a net by performing one or more path search operations, where each path search operation identifies one set of path expansions that can be used to define a segment of a route for the net. A path search operation in some embodiments performs a viability check for each path expansion that it identifies, in order to ensure that any segment that might eventually result from an identified set of path expansions satisfies its minimum required length.

The routing method of some embodiments defines routes for a set of received nets in a multi-layer IC layout. This method defines the routes in a manner that ensures that each segment of each route that connects to a routable element or via (where a via is an element of a route that is used to direct the route from one layer to another) is along a direction that is available for connecting to the routable element or via.

In some embodiments, the minimum length requirements and the available connection directions for all possible combination of route segments, routable elements, and vias is pre-tabulated offline. These pre-tabulated requirements and connection rules are then accesses by the router during a routing operation to speed up the routing operation.

I. Terms and Concepts

Figure 1:
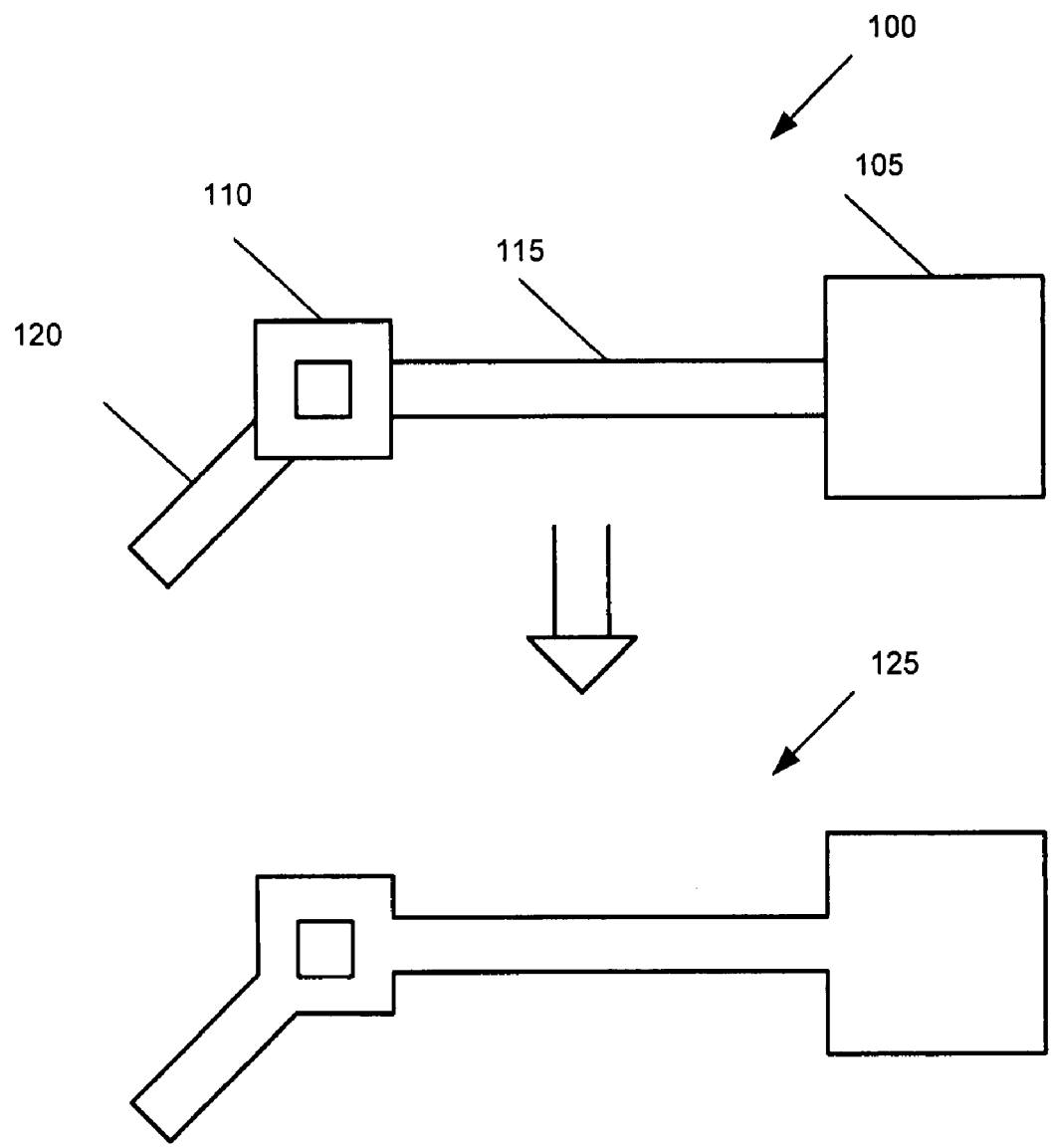
FIG. 1 illustrates an example of geometries in an IC layout design and the resulting metal structures during the manufacturing process.
Figure 2:
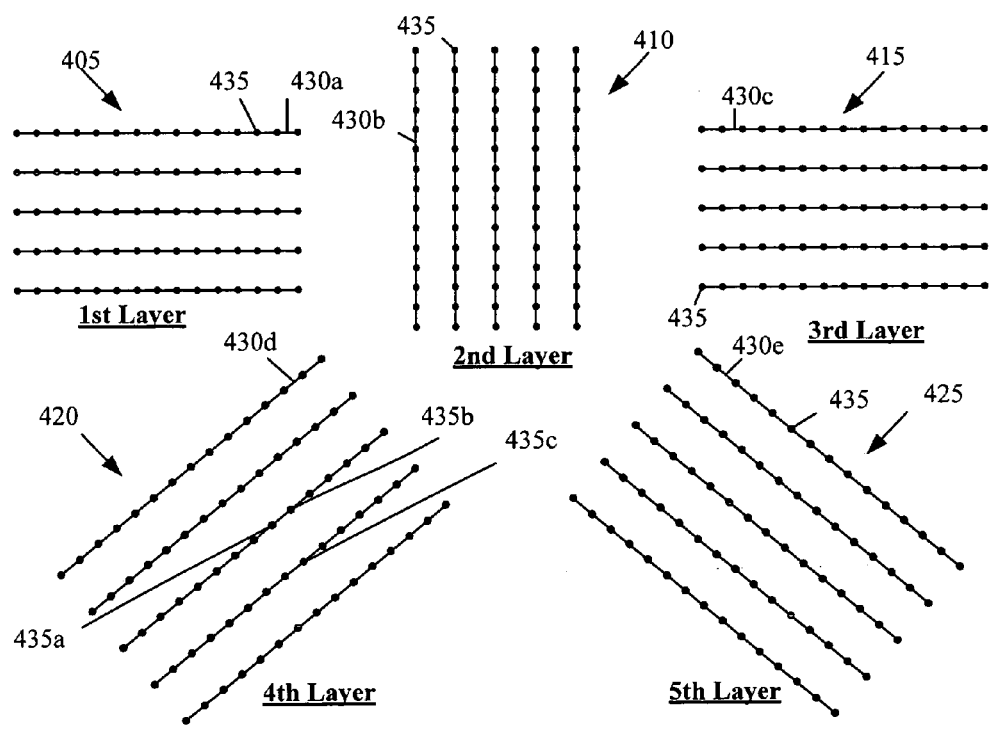
FIG. 2 illustrates a five-layer wiring model.

A detailed router defines detailed routes for nets in an IC layout. Each net includes a set of routable elements in the IC-layout region. The routable elements are pins in the embodiments described below, although they might be other elements in other embodiments. In some embodiments, the router uses a five-layer wiring model that is illustrated in FIG. 2. As shown in this figure, this wiring model has horizontal wiring on wiring layer 1, vertical wiring on wiring layer 2, horizontal wiring on wiring layer 3, +45° diagonal wiring on wiring layer 4, and −45° diagonal wiring on wiring layer 5. One of ordinary skill will realize that the router can use other wiring models in other embodiments. In some embodiments, an interconnect line is "horizontal" or "vertical" if it forms an angle of 0° or 90° with respect to one of the coordinate axes of the layout. On the other hand, a line is "diagonal" if it forms an angle other than 0° or 90° with respect to the layout's Cartesian coordinate axes, which are typically parallel with the layout's boundary and/or the boundary of the layout's expected IC. For instance, in some embodiments, a 45° diagonal line is one that is at 45° (in the counterclockwise direction) with respect to the x-axis, while a −45° diagonal line is one that is at −45° (in the counterclockwise direction) with respect to the x-axis.

In the embodiments below, the horizontal, vertical, and ±45° routing directions are available on each wiring layer. (However, as further described below, each layer has one preferred routing direction.) The four routing directions on each layer provide eight possible directions (called segment directions) for a route to traverse from any point on a layer. These segment directions are 0°, 45°, 90°, 135°, 180°, 225°, 270°, and 315°.

Figure 3:
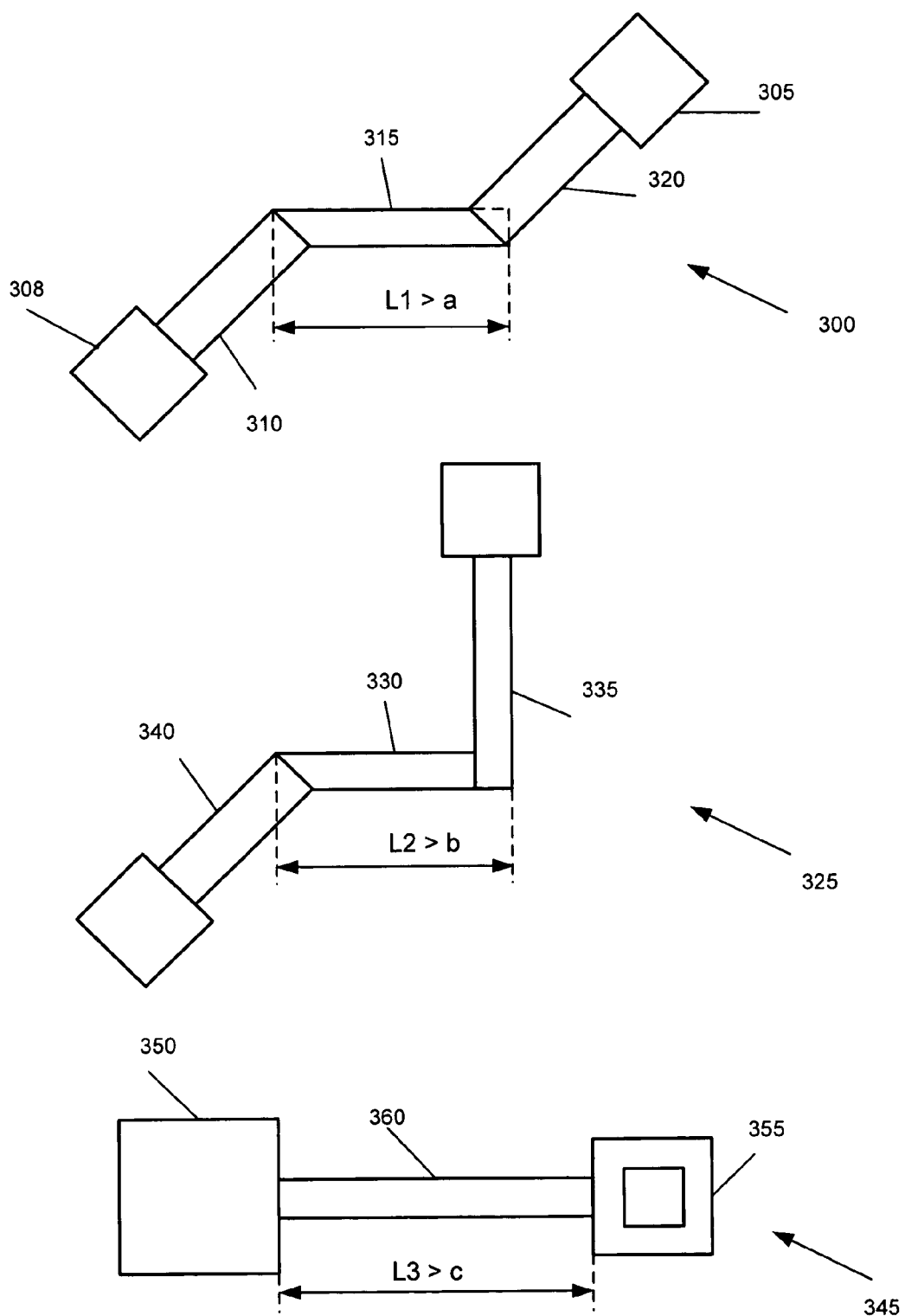
FIG. 3 shows examples of minimum edge length requirements.

A route has one or more route segments. A route segment is a portion of a route that is straight and is along a particular routing direction. In this document, the phrase "interconnect line" is synonymous with "route segment," and the two phrases are often used interchangeably. FIG. 3 provides several examples of detailed routes. Net 300 is an example of a particular two-pin net. This route connects the two pins 305 and 308 of the net. As shown in FIG. 3, the route has different segments with different widths and spacing constraints. Specifically, this route has three segments 310, 315, and 320. Segment 315 is a horizontal Manhattan routing segment that has a length of $L_1$. Segments 310 and 320 are 45° diagonal segments that may have different widths and lengths than segment 315. As shown in FIG. 3, in order for the manufacturing process to correctly approximate the net 300, the length $L_1$ of segment 315 has to be at least as long as a minimum length "a". The value of the minimum length is determined by doing extensive analysis of the manufacturing process and yield for each particular net such as 300. As described in Section II.D.1 below, this analysis is done once and the results are pre-tabulated and made available for the router to use during the routing process.

Net 325 is an example of another two pin net. In this net, there are two Manhattan routing segments 330 and 335 and one 45° diagonal segment 340. Segment 330 is a horizontal and segment 335 is a vertical Manhattan segment. Each segment may have different lengths or widths. In this example, segment 330 which is between the two other segments has to have a minimum length of "b" which may be different than the minimum length required for the horizontal Manhattan segment 315 of net 300.

The third example is another two-pin net 345. This net consists of a pin 350 and a via 355 that are connected by a horizontal Manhattan segment 360. In this example, the Manhattan segment has to have a minimum length "c" that may be different than the other two horizontal Manhattan segments 315 and 330. The minimum length requirement of a segment is, therefore, dependent on the shape and type of the segment itself and the shape of the circuit geometries connected by the segment.

To route a set of nets, the embodiments described below first define a routing graph that includes a routing grid for each routing layer. As illustrated in FIG. 2, each routing layer has a preferred routing direction in some embodiments. In some of these embodiments, each routing grid of each particular routing layer includes numerous routing tracks that are in the preferred routing direction of the particular routing layer. For instance, FIG. 4 illustrates five routing grids 405-425 for the five-layer wiring model of FIG. 2. Each of these routing grids includes numerous tracks 430 that are in the preferred routing direction of their layer. For example, the routing grid 420 for the fourth layer has numerous tracks 430*d* that are in the +45° preferred routing direction of the fourth layer in the five-layer model of FIG. 2.

Each track is formed by numerous edges that connect numerous grid points 435 along the track. The router is said to be a "gridded" router when the grid points in the routing graph (i.e., the grid points in all the routing grids) do not include all the grid points of the manufacturing grid, which is the grid used by the IC manufacturing process. On the other hand, the router is said to be "gridless" when its routable states (e.g., its grid points, nodes, lines, surfaces, etc.) are not aligned with any arbitrary routing grid. The routable states of a gridless router are typically aligned with the grid of the manufacturing process (i.e., typically each point on the manufacturing grid is a routable state in one of the routing grids), so that the final layout can be easily manufactured. However, in certain instances, the gridless routers might not even be aligned with the manufacturing grid. In some cases, the gridless routers are aligned with a grid that is even finer (i.e., has a higher resolution) than the manufacturing grid.

The grid points along the tracks serve as the start, intermediate, termination, and bend points of routes. On a particular layer, a route segment can go from a first grid point on a first track to a second adjacent grid point on a second track (i.e., a route can have a segment that traverses the particular layer in a direction that is not the preferred direction of the particular layer), but such a route segment is assessed a cost that is greater than a segment that connects two adjacent grid points along the same track. This differential in costing is what makes the directions illustrated in FIG. 4 preferred directions. In other words, the directions of the tracks illustrated in FIG. 4 are preferred directions of their layers because routing along these directions is less costly than routing along other directions on these layers. For instance, on the fourth layer, a route segment that connects two adjacent grid points 435*a* and 435*b* costs less than a route segment that connects the two adjacent grid points 435*a* and 435*c*.

Figure 5:
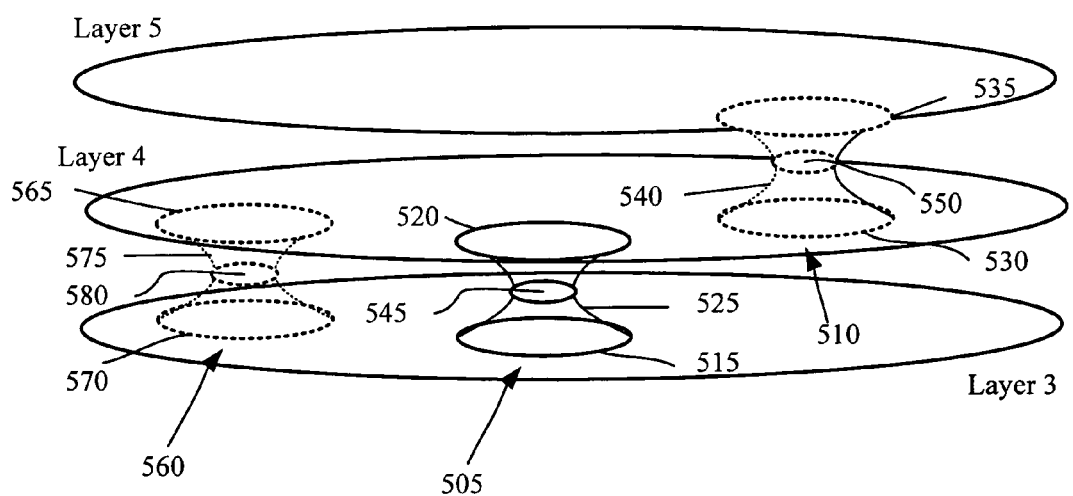
FIG. 5 illustrates three vias.

In the embodiments described below, a route can traverse multiple layers. Such a route is a multi-layer route. A multi-layer route uses at least one non-planar segment to traverse from one layer to another. This non-planar segment is called a via. In some embodiments, a via includes (1) one pad on each of the two layers that it traverses and (2) a cut that is the three-dimensional hole between the two layers. FIG. 5 illustrates three vias, a first via 505 that is between wiring layers 3 and 4, a second via 510 that is between wiring layers 4 and 5, and a third via 560 that is between wiring layers 3 and 4. Via 505 has pad 515 on layer 3, pad 520 on layer 4, and cut 525 between layers 3 and 4. Via 510 has pad 530 on layer 4, pad 535 on layer 5, and cut 540 between layers 4 and 5. Via 560 has pad 570 on layer 3, pad 565 on layer 4, and cut 575 between layers 3 and 4.

Figure 6:
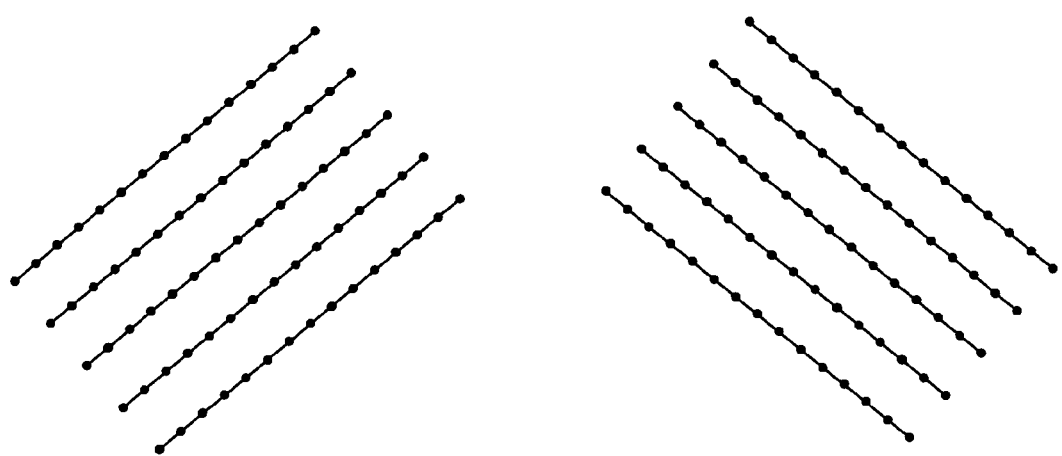
FIG. 6 illustrates two cut planes that are used for defining vias between the fourth and fifth layers of the routing model illustrated in FIGS. 2 and 4.

To account for vias between each pair of adjacent layers, the routing graph of some embodiments described below includes two cut planes for each pair of adjacent layers, where one cut plane mirrors the tracks on one layer and the other cut plane mirrors the tracks on the other layer. For instance, FIG. 6 illustrates the two cut planes that are used for defining vias between the fourth and fifth layers 420 and 425 of the routing model illustrated in FIGS. 2 and 4. As further described below, some embodiments use the cut planes to mark up the regions in the layout that are not available for via transitions. Two cut planes are used between each two adjacent layers in order to simplify the mapping of blocked unroutable areas from the layers onto the via cut planes.

In the description below, the term geometry or geometries refers to previously defined items in the layout that have to be considered while routing a net. Such previously defined items include obstacles as well as previously defined routes, which have planar route segments and vias (i.e., via pads and cuts).

II. Identifying Viability of Path Expansions Based on Minimum Lengths and Geometry Connection To facilitate manufacturing of ICs and satisfying design rules, some embodiments have minimum length requirements for route segments generated during the routing process. The minimum length constraints are only one of the criteria some embodiments use to determine the viability of a segment of a route. Examples of other criteria for viability check during routing process are described in U.S. patent application Ser. No. 10/751,332 entitled "Method and Apparatus for Routing", now issued as U.S. Pat. No. 7,197,738, filed on Jan. 2, 2004. This application is incorporated herein by reference.

A. Route Generation

Figure 7:
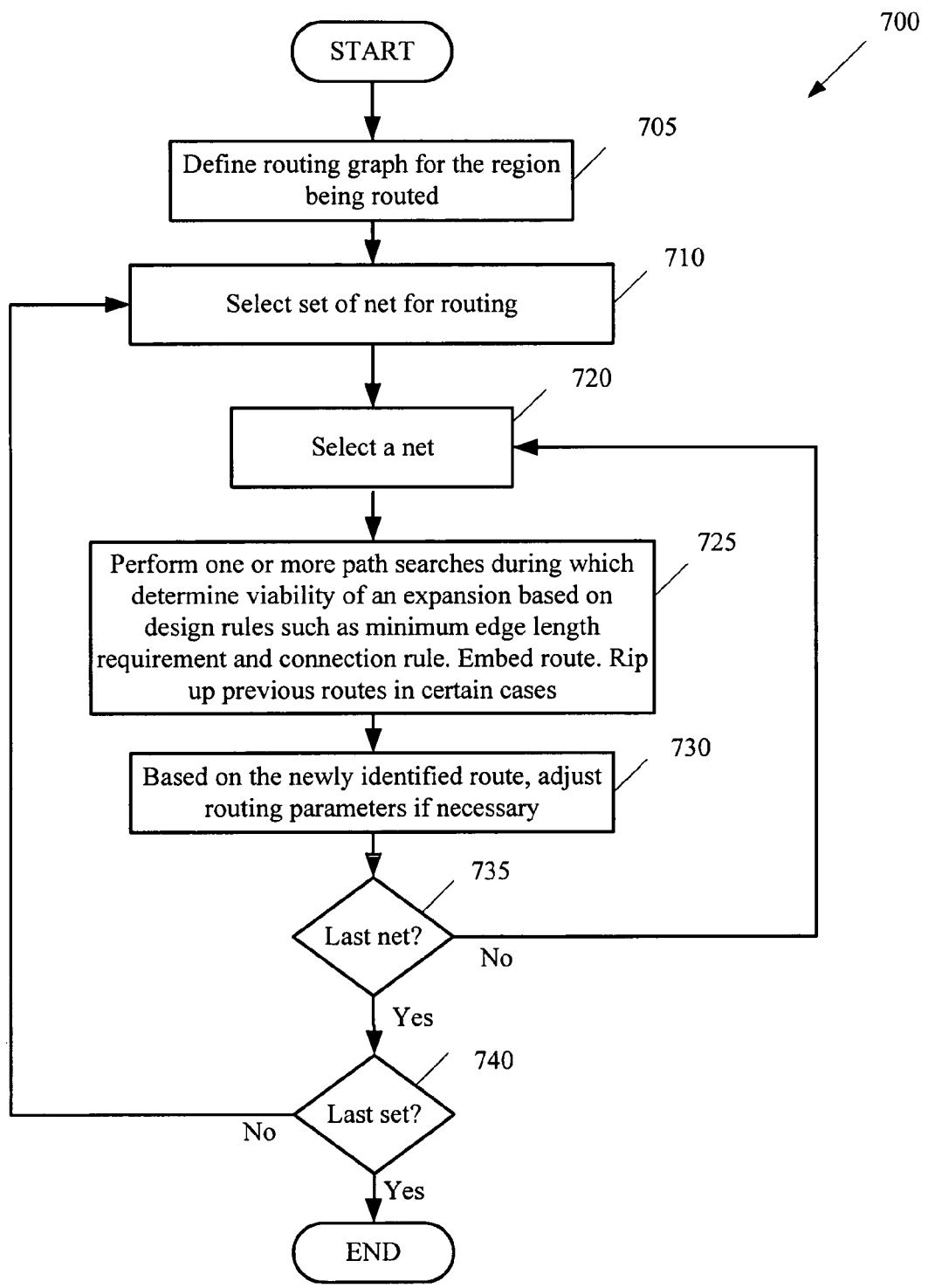
FIG. 7 illustrates the overall flow of a router that uses the minimum edge length rules for viability checking.

FIG. 7 illustrates the overall flow of a router that uses the above-described minimum edge length and connection rules. As shown in this figure, the router initially defines (at 705) a routing graph for the region being routed. In some embodiments, the routing graph includes (1) a routing grid for each wiring layer and (2) two cut-plane grids for the vias between each pair of adjacent layers. The above-described FIG. 4 illustrates examples of five routing grids for the five wiring layers of FIG. 2, while the above-described FIG. 6 illustrates an example of two cut planes for vias between the fourth and fifth wiring layer of the wiring model illustrated in FIG. 2.

After 705, the process selects (at 710) a set of nets for routing. The process next selects (at 720) a net to route. It then performs (at 725) one or more path searches to identify a route for the net, where each path search result connects two pins of the net or connects a pin of the net to a previously defined segment of the route. After each successful path search (i.e., each path search that reaches a target grid point from a start grid point), the process in some embodiments performs a back-trace operation that defines a route segment that traces the set of expansions that connected the start and target grid points. Detailed description of back-trace operation is described in the above incorporated U.S. patent application Ser. No. 10/751,332.

The path search and/or embedding operations might in some embodiments result in the rip-up of routes defined previously for previously routed nets. When the process rips out a previously defined route for a particular net, the process adds the particular net to the group of nets that it needs to route, and then later re-routes this net. As described in Section II.E below, each path search uses a process to determine whether any resulting interconnect lines satisfy specific minimum edge length and geometry connection requirements.

After 725, the routing process 700 (at 730) adjusts, if necessary, routing parameters such as available grid points for routing in different directions based on each geometry of the just defined route (i.e., the route defined in the last iteration through 725). Detailed description of adjusting available grid points is described in the above incorporated U.S. patent application Ser. No. 10/751,332.

After 730, the process determines (at 735) whether it has examined all the nets in the set selected at 710. If not, the process returns to 720 to select another net, and repeats the operations 725 and 730 for this net. Otherwise, the process determines (at 740) whether it has defined routes for all the sets of nets that it needs to route. If not, the process returns to 710 to select another set of nets to route, and then repeats 715-735 for this set of nets. When the process determines (at 740) that it has examined all the sets of nets, the process terminates.

B. Path Search

As mentioned above, each path search that the routing process 700 performs uses the minimum edge length and connection rules to figure out viability of path expansions that it identifies. These rules will be described further below. The routing process 700 might use one of many different path search techniques (such as line search, maze search, A*, etc.) at step 725 to identify one set of expansions that connect source and target grid points that are defined for each path search. In identifying a set of expansions that connect source and target grid points for a path search, a path search process typically explores numerous path expansions. Exploring a path expansion, which starts at a particular grid point (called a start point) and goes to a particular grid point (called a destination point), often entails (1) identifying the potential for the expansion, (2) determining the viability of the path expansion, and when the expansion is viable, (3) costing the expansion. In some embodiments, minimum edge length and geometry connection constraints are two rules that can be used to determine the viability of a path expansion.

C. Values to be Saved or Checked for Path Expansion Viability Determination

In some embodiments, one of the criteria used for viability checking is to determine whether certain geometries can be connected and certain interconnect lines meet a minimum length requirement. As described in Section II.A above, after each path expansion, the router determines whether the path expansion direction and length would violate a set of requirements, which include minimum-length and connection-direction requirements.

Figure 8:
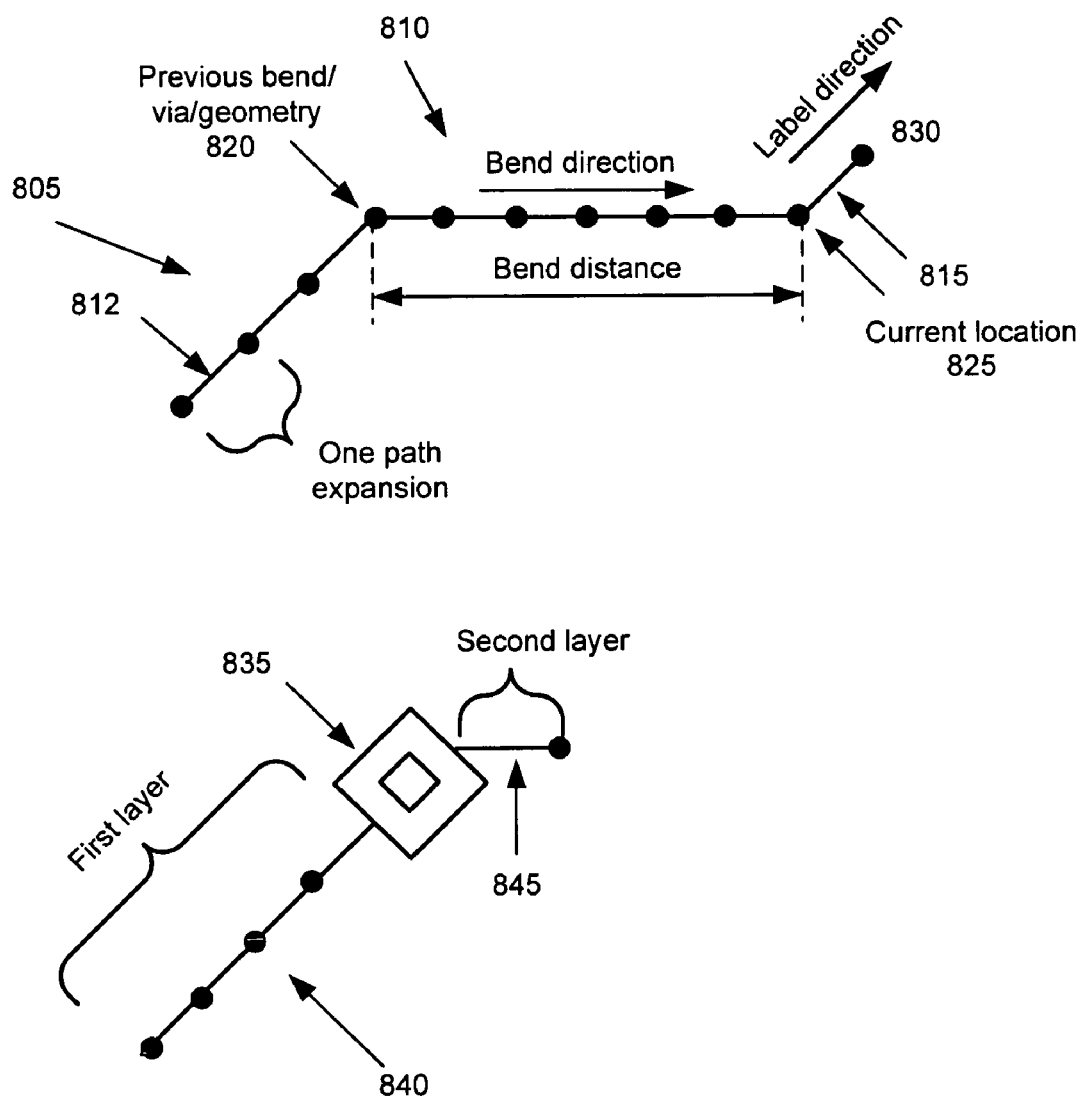
FIG. 8 shows examples of viability check parameters to do minimum edge length and geometry connection validity checks.

FIG. 8 illustrates two examples for portions of an IC layout design. The first example illustrates a set of path expansions identified by the path search process used by the router. The set includes a 45° portion 805, i.e., a sub-set of collinear path expansions followed by a horizontal Manhattan portion 810, i.e., a sub-set of collinear path expansions. Each one of theses portions are comprised of several path expansions 812. The last path expansion identified by the router is path expansion 815 from the source grid point (also referred to as label) 825 to the destination grid point 830. For this path expansion, the router performs a viability check before costing and storing it as a viable path expansion.

As described further below, in order to do this viability check, the router has to keep track of the direction of the last bend in the set, the distance from the last bend 820 to the current source grid point 825, and the direction of the current path expansion referred to as label direction. As described below, the router uses these values to determine viability of the current path expansion. After each path expansion is identified, the router ensures that certain resulting set of collinear path expansions have a minimum length.

The second example illustrates a via 835 being added at the end of a set of path expansions 840 identified by the router. As described below, the router ensures that connecting the particular via shape to the interconnect line 840 does not violate any viability rules. If the via can be defined in the current location, the router saves the via shape. The information about the via shape will be used when the router has to check the viability of a subsequent path expansion such as 845 originating from the via 835.

D. Pre-Tabulating Viability Criteria

1. Pre-Tabulating Minimum Edge Length Requirements

In order to facilitate determining whether minimum edge length requirements are met, the router pre-tabulates all possible combinations of two circuit geometries connected to each other by path expansions. This tabulation is done once and will be used repeatedly during the routing process. FIG. 9 conceptually illustrates rule table 900 to specify the minimum edge length requirements for any interconnect segment located between two other circuit geometries or interconnect segments.

The table 900 has four columns. The first column 905 and the third column 915 list all available geometries for the IC layout design. The second column 910 lists all possible path expansions between two planar start and a destination grid points. For instance, if the routing system allows both Manhattan and 45° segments, as indicated in Section I above there would be 8 possible planar path expansion directions from any grid point on the IC layout. Table 900 lists all possible combinations of starting geometries, connecting path expansions, and destination geometries. For example, if the IC design tool allows for 50 different circuit geometries and eight possible path expansion directions, table 900 would have 50 times 8 times 50 or 20,000 rows.

For each combination of start geometry, interconnect lines, and destination geometry, table 900 lists the minimum length requirement of the connecting path geometry. For instance, first row 925 specifies that whenever a 45 interconnect line is connecting two horizontal Manhattan segments, the 45 interconnect line has to have a minimum length of "a" units. Some entry combinations such as the third row 930 may specify a combination that does not require a minimum edge length requirement. Entries in table 900 are derived by extensive analysis of and refinement of geometry shapes and the corresponding shapes resulted during manufacturing process. Once satisfactory results are found, they are tabulated and are repeatedly used during run-time when the router determines whether a particular path expansion satisfies the minimum edge length requirements.

2. Pre-Tabulating Geometry Connection Requirements

Figure 10:
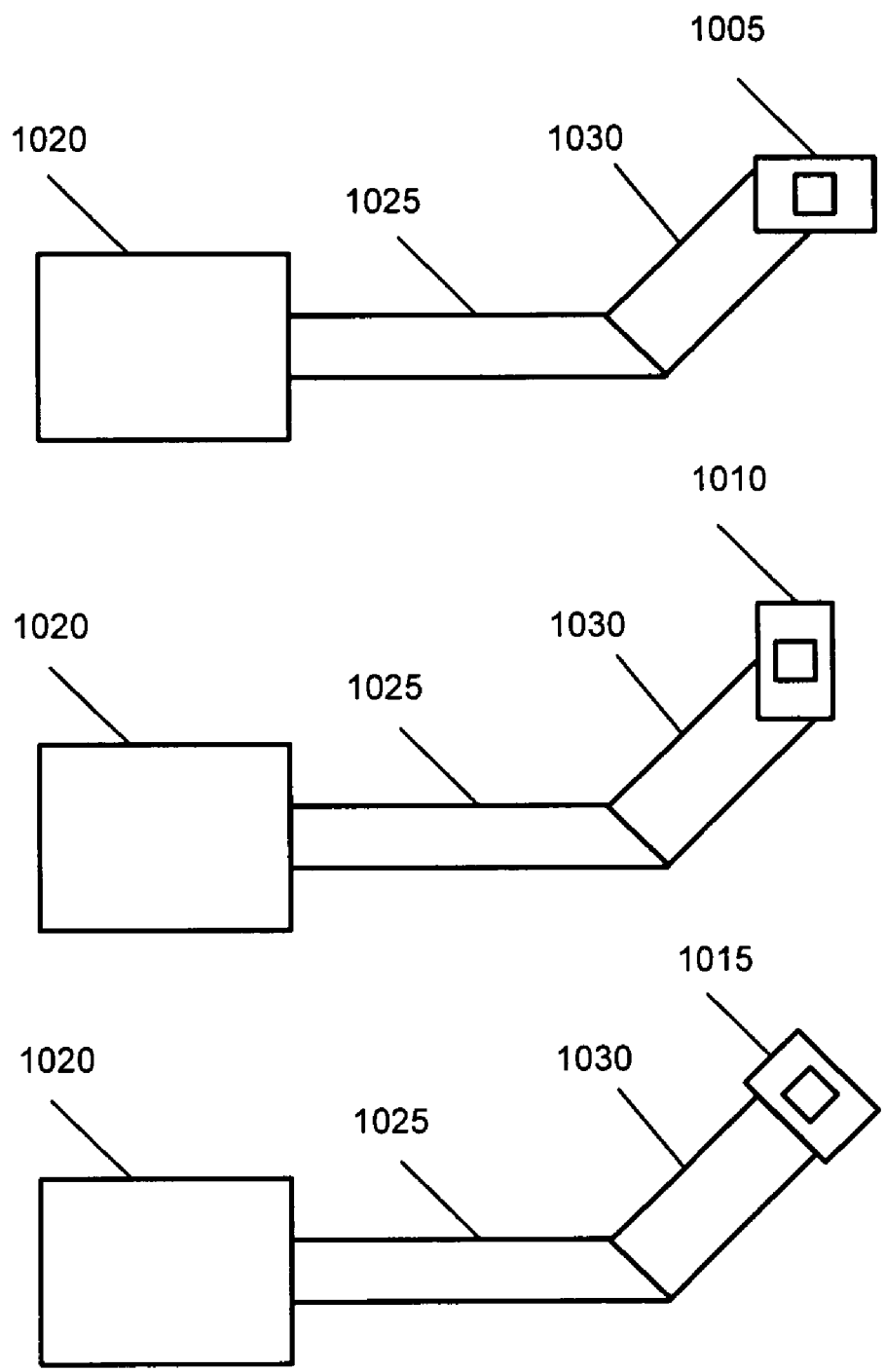
FIG. 10 shows examples of using different shapes for vias.

In addition to minimum length requirements for interconnect segments, the router in some embodiments has additional restrictions for the direction of interconnect lines that can originate from or terminate to certain circuit geometries. For example, FIG. 10 conceptually illustrates three different vias 1005, 1010, and 1015. Each via has a different shape.

Each via is connected to a pin 1020 by two segments of interconnect lines 1025 and 1030. Segment 1030 that connects to the vias is a 45° segment. There may, however, be different design or manufacturing constraints that does not allow a 45° interconnect segment to connect to Vias 1005 and 1010 with their particular shapes. The constraints may be for variety of reasons such as creating acute angles or creating edges at the interconnection of the via and routing segments that are less than a minimum length to be manufactured properly.

Figure 11:
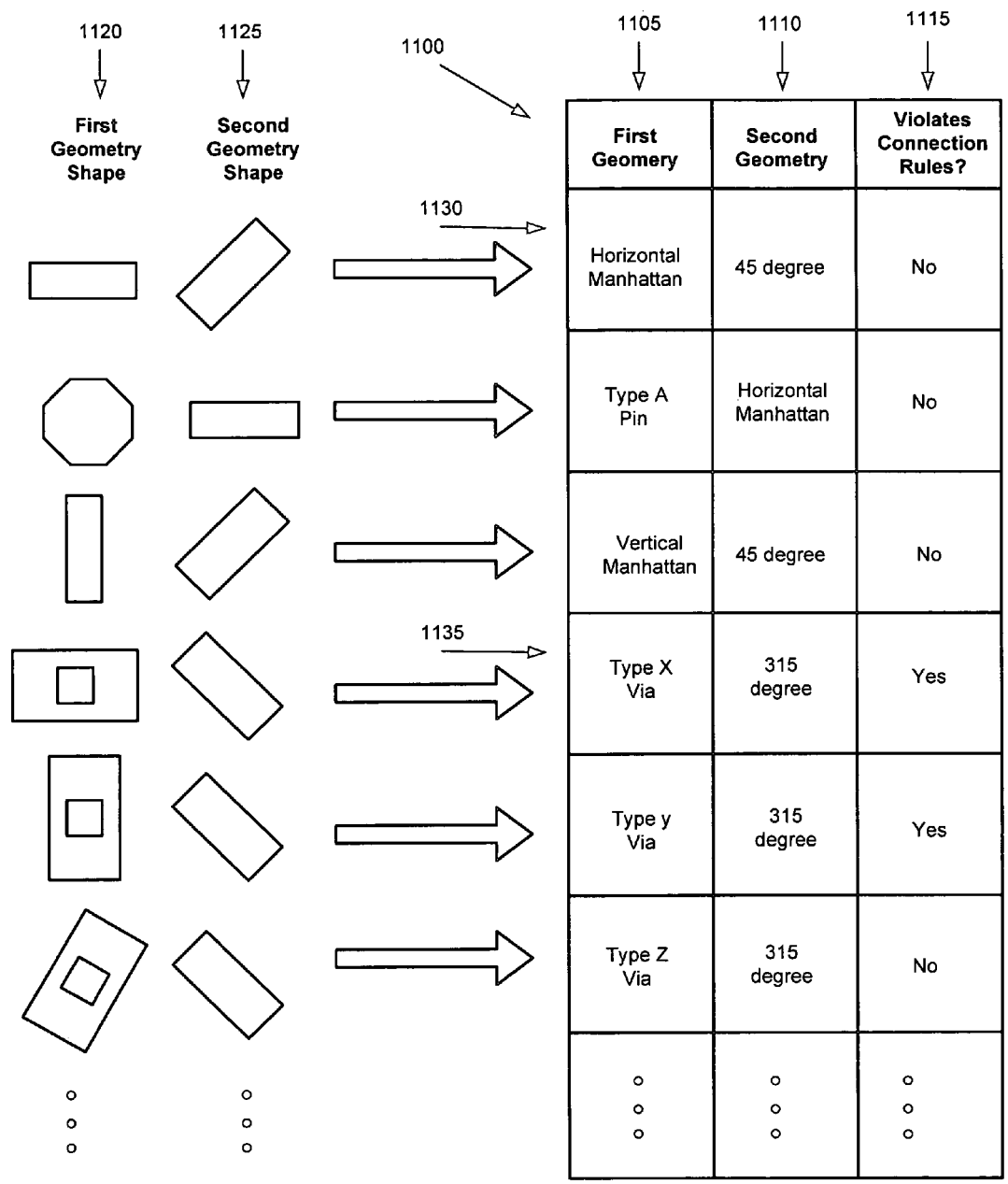
FIG. 11 conceptually illustrates an example of a rule table for connecting two geometries.

In order to avoid violating these design or manufacturing constraints, some embodiments pre-tabulate all geometries in a table that specifies which two shapes may or may not be connected together. This tabulation is done once and will be used repeatedly during the routing process. FIG. 11 illustrates a table 1100 that lists all possible combinations of available circuit geometries. The table has three columns. The first two columns 1105 and 1110 list all possible geometry combinations. For example, if the IC design tool allows 50 different geometries, the table will have 50 times 50 or 2,500 rows.

To better illustrate the concept, FIG. 11 also depicts the conceptual shapes of each geometry on two columns 1120 and 1125 on the left side of the table. For instance the first row 1130 of table 1100 indicates that a 45° path expansion can be originated from the end of a horizontal Manhattan path expansion without violating any connection rules. On the other hand, the fourth row 1135 of the table indicates that originating a 135° path expansion from a type X via would violate connection expansions. This may be due to different manufacturing restrictions such as creating an acute angle or a very short edge at the connection point. As described in Section II.E below, the routing process utilizes the information in this table to determine if the direction of a path expansion is available at any grid point that already has a circuit geometry in it.

E. Determining the Viability of the Path Expansion

Figure 12A:
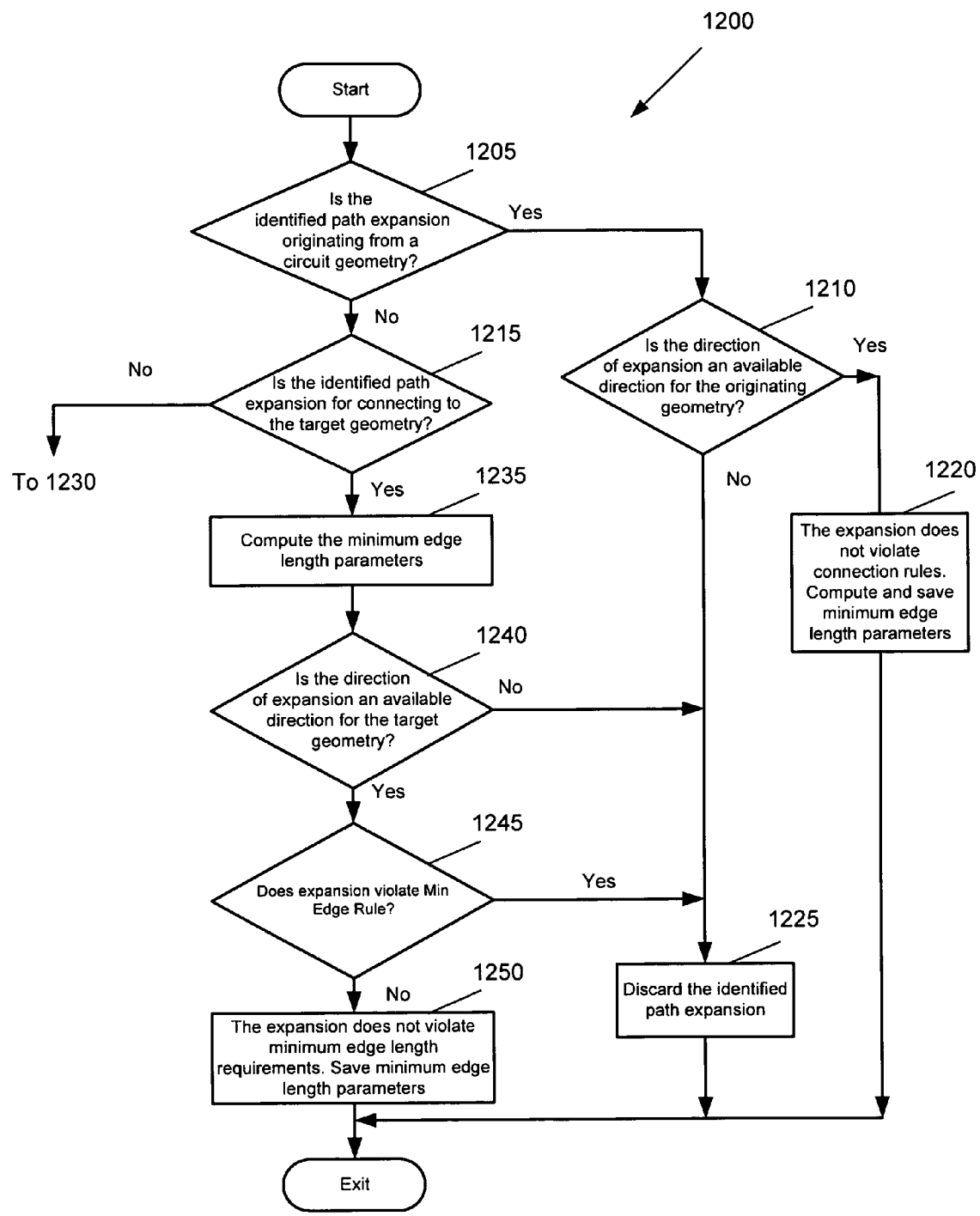
FIGS. 12A and 12B illustrate a process to perform minimum edge length and connection viability checks.
Figure 12B:
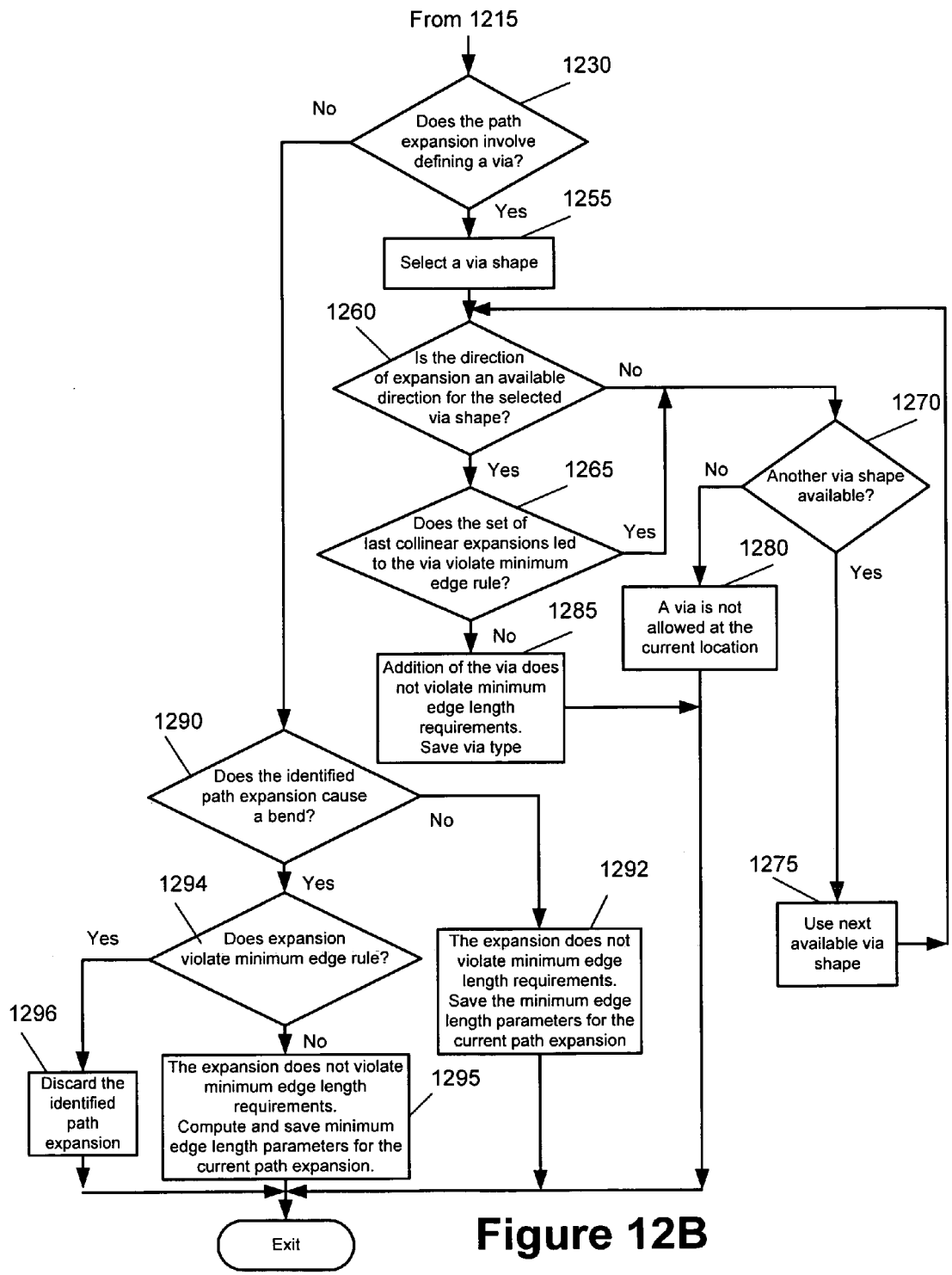

FIG. 12 illustrates a process 1200 that determines if an identified path expansion by the router 700 at step 725 would violate either the minimum edge length rule or the connection rule. At 1205, the process 1200 determines if the identified expansion is originating from a circuit geometry. This condition can happen when the path expansion is originated either from the source geometry or from an already defined via.

If the process 1200 determines that the path expansion has not originated from a circuit geometry, it proceeds to 1215 which will be described below. Otherwise, the process determines (at 1210) whether the path expansion is allowed to originate from the particular circuit geometry. FIG. 13 conceptually illustrates a path expansion 1305 originating from a circuit geometry 1310 at a source grid point and terminating at a destination grid point 1315. The source grid point can be at the center of the geometry (as illustrated) or it could be inside or at a boundary of the geometry. A geometry may be associated with only one grid point in some embodiments, or may be associated with multiple grid points within interior or about its boundary in other embodiments. Since there are only the source geometry and the path expansion are involved and the current path expansion has not reached either a bend or another circuit geometry, no minimum edge length check is required in the example illustrated in FIG. 13. However, at 1210 the process 1200 has to determine whether the connection rule is violated.

As described in Section II.D.2 above, the allowed connections for all combinations of available circuit geometries are pre-tabulated in a table such as table 1100 conceptually illustrated in FIG. 11. If the direction of the expansion does not violate the connection rule, the process 1200 marks the current expansion as not violating the Min Edge Length rule and proceeds to other steps in the routing process. The process 1200 also computes and saves (at 1220) the minimum edge length parameters, i.e., the length and the direction of the current path expansion. The process will then terminate. If, on the other hand, at 1210 the expansion is determined to violate connection rules, the expansion is discarded (at 1225) and the process terminates.

If at 1205 the process determines that the identified path is not originated from a circuit geometry, the process 1200 determines (at 1215) whether the path expansion connects to the target geometry. If the path expansion does not connect to the target geometry, the process will proceed to 1230 which will be described below. Otherwise, the process uses several steps that are conceptually illustrated in FIG. 14 to check the geometry connection and minimum edge length rules.

FIG. 14 illustrates a current path expansion 1410 that terminates at the target geometry 1405 located at the destination grid point. The destination grid point can be at a boundary of the target geometry (as illustrated) or it can be inside the geometry. At 1235, the process 1200 determines the direction of the path expansion and computes the length of the set of collinear path expansions leading to the target geometry. For instance, FIG. 14 shows an example of three collinear path expansions including the current path expansion 1410 leading from the last bend 1415 to the target geometry 1405. The length of the set of these collinear expansions is the length of the edge between the last bend 1415 in the interconnect line (or the last circuit geometry if there was no bend in the interconnect line) and the target geometry 1405. This length is the sum of the length of each individual path expansion in the collinear path expansion set including the current path expansion 1410.

Next, at 1240 the process 1200 by referring to table 1100 determines whether the direction of the expansion 1410 is an available direction to terminate at the target geometry 1405. If the direction is not available, then the identified path expansion is discarded (at 1225) and the process exits. Otherwise, at 1245 the process determines whether the path expansion violates the minimum edge length requirements.

As described in Section II.D.1 above, the minimum edge lengths of all types of path expansions between any two available circuit geometries are pre-tabulated in a table such as table 900 conceptually illustrated in FIG. 9. This table specifies the minimum length for an interconnect line located between two geometries such as the target geometry 1405 and the last interconnect band (or last geometry) 1415. The process 1200 compares (at 1245) the minimum length specified in the table with the length of the set of collinear expansions leading to the target geometry. If the length of the collinear set of expansions leading to the target geometry is less than the minimum length specified in table 900, the process discards (at 1225) the identified path expansion and exits. On the other hand, if the path expansion does not violate the minimum edge length rule, the process 1200 marks it (at 1250) as not violating the minimum edge length rule and proceeds to other steps of the routing process. The process 1200 also saves the parameters calculated at 1235 for use in minimum edge length analysis of other path expansions originating at the end of the current path expansion.

Next, at 1230, the process 1200 determines if the path expansion is for defining a via. If the path expansion is not for defining a via, the process will proceed to 1290 which will be described below. Otherwise, at 1255 the process selects a via shape. The process, then determines if the selected via shape can be defined at the current location. FIG. 15 conceptually illustrates a via 1505 to be added at the current grid start location 1510. The via may be defined in such a way that the current grid point be at its boundary (as illustrated) or inside the via geometry. The example in FIG. 15 also shows a set of collinear path expansions between the current grid location 1510 and the previous path expansion bend or circuit geometry 1515.

At 1260, by referring to table 11, the process 1200 determines if the via shape is allowed on the direction of the set of collinear path expansions leading to the grid location where the via is being defined. If the particular via shape is not allowed, the process determines (at 1270) whether another via shape is available. If another via shape is available, at 1275 the process selects the next available via shape and proceeds back to 1260. Otherwise, if no other via shape is available, the process determines (at 1280) that no vias are allowed at the end of the last collinear path expansions. The process then exits.

If at 1260, the process determines that the particular via shape is allowed, the process proceeds to 1265 to determine if the length of the last set of collinear path expansions leading to the via is more than the minimum length specified in table 900. The process does this by finding the current via 1505 shape, the previous circuit geometry 1515, and the current path expansion type in table 900. The process then compares the minimum length indicated in the table with the length of the set of collinear path expansions.

If at 1265 the process determines that the length of path expansions set is not long enough, the process proceeds back to 1270 which was described above. If, on the other hand, the minimum length requirement is met, the process specifies (at 1285) that the selected via shape does not violate connection or minimum edge length rules. The process saves the selected via shape for further analysis by the routing process and exits.

Figure 16:
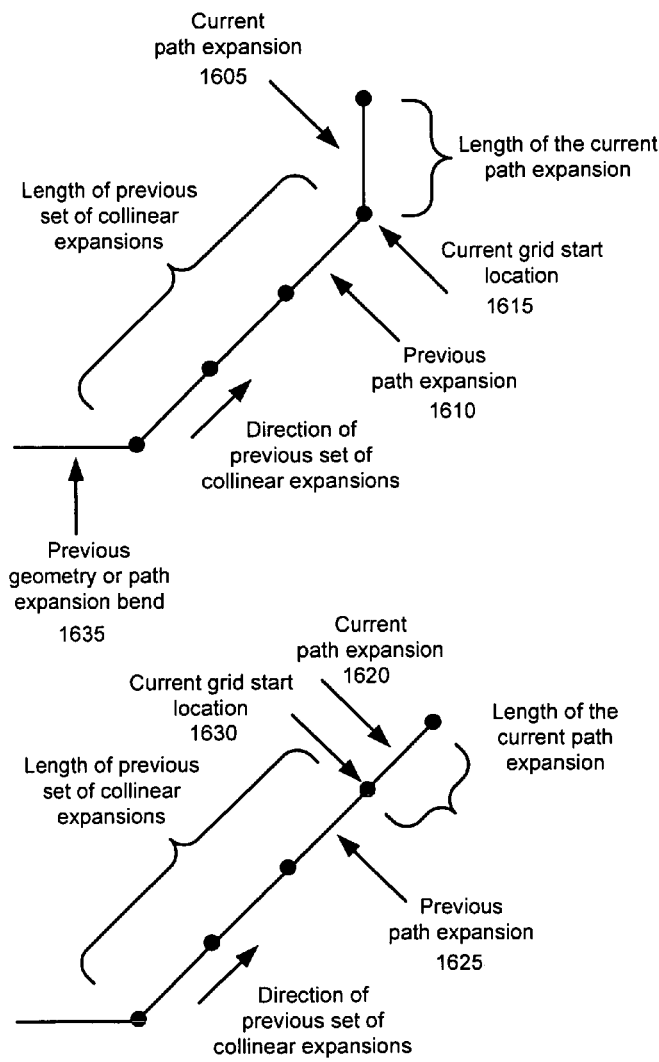
FIG. 16 illustrates adding a path expansion to the end of another path expansion.

If at 1230, the process determines that no via is to be defined at the current grid location, the process will proceed to 1290 to determine if the current expansion creates a bend in the interconnect line. FIG. 16 conceptually illustrates two different scenarios for the current path expansion. In the first scenario, the current path expansion 1605 is not in the direction of the previous path expansion 1610 and, therefore, causes a bend at the current grid start location 1615. In the other scenario, however, the current path expansion 1620 is in the same direction of the previous path expansion 1625 and does not cause a bend at the current grid start location 1630.

To determine whether the current path expansion causes a bend, the process compares (at 1290) the directions of the current and the previous path expansion. If the two directions are not the same, the process will proceed to 1294 which will be described further below. Otherwise, the process marks (at 1292) the current path expansion as not violating the minimum edge length rule and proceeds to other steps of the routing process. The process also computes and saves the minimum edge length parameters for the current expansions. The process does this by adding the length of the current path expansion to the length of the previous set of collinear path expansions leading to the current grid start point. The process also saves the direction of the current expansion. The process then exits.

If at 1290, the process determines that the current expansion causes a bend in the interconnect line at the current grid location, the process refers to table 900 to determine if the length of the previous set of collinear path expansions from the previous bend or geometry 1635 to the current grid start location 1615 is more than the minimum length specified in the table. If the length of the collinear set is not more than the length specified in the table 900, the process discards (at 1296) the identified path expansion and exits. Otherwise, the process marks (at 1295) the current path expansion as not violating the minimum edge length rule and proceeds to other steps of the routing process. The process also computes and saves the minimum edge length parameters. These parameters are the direction of the current path expansion and the length of the current path expansion. After saving the information, the process exits.

Ensuring interconnect lines have at least a minimum length and controlling the direction of interconnect lines that can connect to particular geometries facilitates IC manufacturing and improves yield. For instance, ensuring a minimum length allows the manufacturing process to utilize techniques such as Optical Proximity Correction to improve IC yield by applying changes to photomask geometries to compensate for nonlinear distortions caused by optical diffraction and resist process effects.

Figure 17:
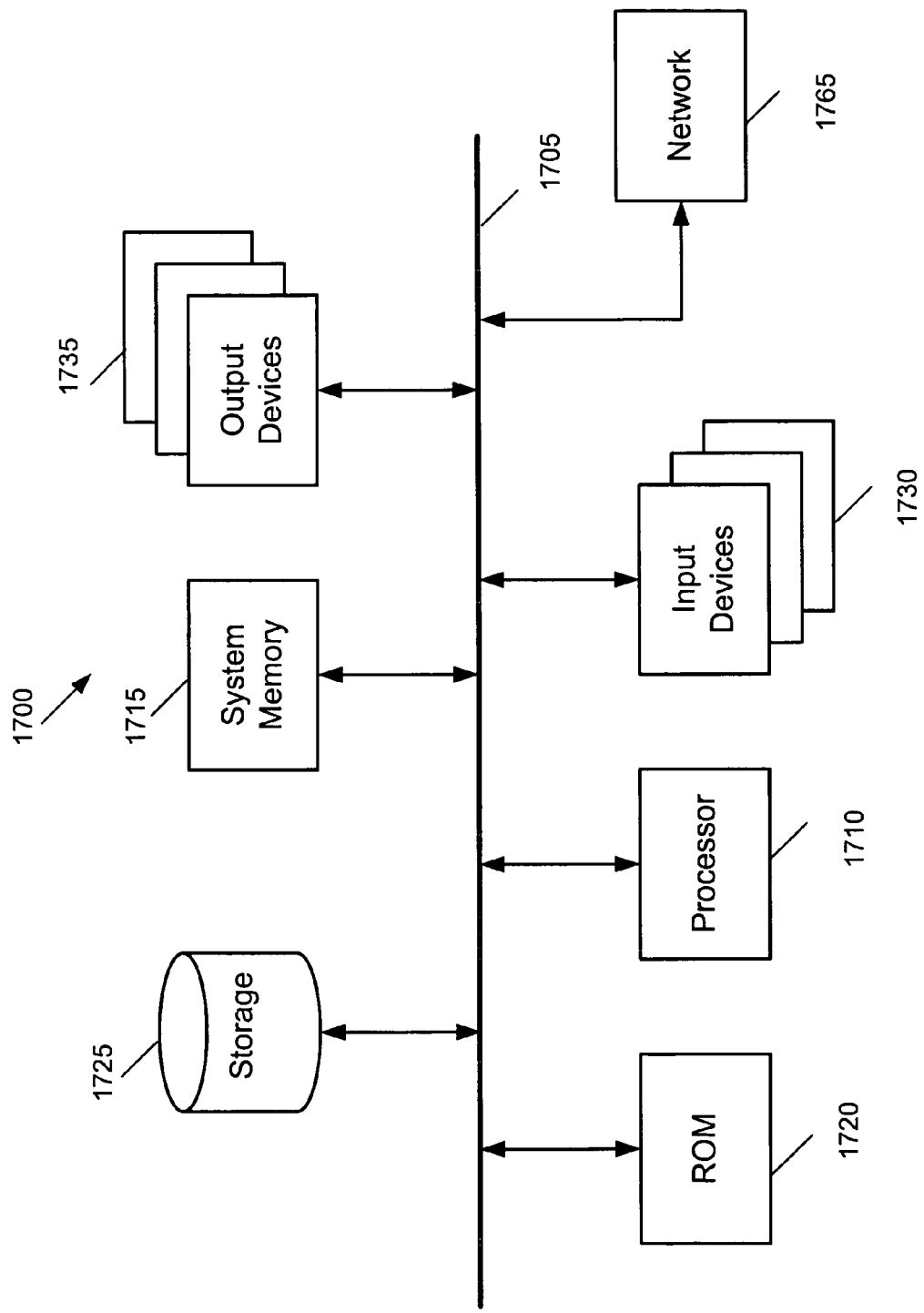
FIG. 17 conceptually illustrates a computer system with which one embodiment of the invention is implemented.

FIG. 17 conceptually illustrates a computer system with which one embodiment of the invention is implemented. Computer system 1700 includes a bus 1705, a processor 1710, a system memory 1715, a read-only memory 1720, a permanent storage device 1725, input devices 1730, and output devices 1735.

The bus 1705 collectively represents all system, peripheral, and chipset buses that support communication among internal devices of the computer system 1700. For instance, the bus 1705 communicatively connects the processor 1710 with the read-only memory 1720, the system memory 1715, and the permanent storage device 1725.

From these various memory units, the processor 1710 retrieves instructions to execute and data to process in order to execute the processes of the invention. The read-only-memory (ROM) 1720 stores static data and instructions that are needed by the processor 1710 and other modules of the computer system. The permanent storage device 1725, on the other hand, is a read-and-write memory device. This device is a non-volatile memory unit that stores instruction and data even when the computer system 1700 is off. Some embodiments of the invention use a mass-storage device (such as a magnetic or optical disk and its corresponding disk drive) as the permanent storage device 1725. Other embodiments use a removable storage device (such as a floppy disk or Zip® disk, and its corresponding disk drive) as the permanent storage device.

Like the permanent storage device 1725, the system memory 1715 is a read-and-write memory device. However, unlike storage device 1725, the system memory is a volatile read-and-write memory, such as a random access memory. The system memory stores some of the instructions and data that the processor needs at runtime. In some embodiments, the invention's processes are stored in the system memory 1715, the permanent storage device 1725, and/or the read-only memory 1720.

The bus 1705 also connects to the input and output devices 1730 and 1735. The input devices enable the user to communicate information and select commands to the computer system. The input devices 1730 include alphanumeric keyboards and cursor-controllers. The output devices 1735 display images generated by the computer system. For instance, these devices display IC design layouts. The output devices include printers and display devices, such as cathode ray tubes (CRT) or liquid crystal displays (LCD).

Finally, as shown in FIG. 17, bus 1705 also couples computer 1700 to a network 1765 through a network adapter (not shown). In this manner, the computer can be a part of a network of computers (such as a local area network ("LAN"), a wide area network ("WAN"), or an Intranet) or a network of networks (such as the Internet). Any or all of the components of computer system 1700 may be used in conjunction with the invention. However, one of ordinary skill in the art will appreciate that any other system configuration may also be used in conjunction with the invention.

While the invention has been described with reference to numerous specific details, one of ordinary skill in the art will recognize that the invention can be embodied in other specific forms without departing from the spirit of the invention. For instance, although several embodiments of the invention were described for a detailed router, one of ordinary skill will realize that these embodiments can also be implemented for global routers. Thus, one of ordinary skill in the art would understand that the invention is not to be limited by the foregoing illustrative details, but rather is to be defined by the appended claims.

We claim:

1. A method comprising:
  performing a path search that identifies a plurality of path expansions, said path search comprising:
  i. performing a viability check on a particular path expansion to ensure that a particular segment of a particular route that would result from the particular path expansion in a design layout satisfies a minimum length criteria by comparing a length of the particular path expansion with a minimum length requirement between at least one pair of circuit geometries, said minimum length requirement being stored in a pre-tabulated table, wherein performing the viability check on the particular path expansion further comprises determining whether a path expansion direction for the particular path expansion is allowable; and
  ii. specifying the particular path expansion for storage in a storage medium as a viable path expansion when the particular path expansion satisfies the viability check,
  wherein the path search that identifies the plurality of path expansions is successfully completed before the particular route for a net in the design layout is specified.

2. The method of claim 1, wherein performing the viability check on the particular path expansion comprises determining whether the particular path expansion connects to a point that is associated with a circuit module.

3. The method of claim 2, wherein the point is a start point, wherein the particular path expansion originates from the circuit module.

4. The method of claim 2, wherein the point is a termination point, wherein the particular path expansion terminates to the circuit module.

5. The method of claim 2, wherein the plurality of path expansions comprises a first bend, wherein performing the viability check comprises determining whether a length of a set of path expansions between the first bend and the point satisfies a particular minimum length criteria.

6. The method of claim 1, wherein the particular path expansion is associated with a via.

7. The method of claim 6, wherein the viability check takes into account a set of shapes for the via.

8. The method of claim 7, wherein the set of shapes for the via comprises first and second shapes, wherein performing the viability check comprises determining whether the first shape is allowable.

9. The method of claim 8, wherein performing the viability check comprises determining whether the second shape is allowable when the first shape is determined not to be allowable.

10. The method of claim 1, wherein at least one circuit geometry is one of a via and a circuit module.

11. The method of claim 1, wherein performing the viability check on the particular path expansion comprises determining whether the path expansion direction is different than a path expansion direction for a previous path expansion.

12. The method of claim 11, wherein the previous path expansion is an immediately previous path expansion.

13. The method of claim 11, wherein when the path expansion direction is different than the path expansion direction for the previous path expansion, performing the viability check comprises determining whether at least one previous path expansion satisfies a particular minimum length criteria.

14. The method of claim 13, wherein the plurality of path expansions comprises a first bend, wherein the particular path expansion is not viable when the at least one previous path expansion that starts from the first bend does not comprise a length that satisfies the particular minimum length criteria.

15. The method of claim 1, wherein the plurality of path expansions comprises first and second bends, wherein performing the viability check comprises determining whether a set of path expansions between the first and second bends satisfies a particular minimum length criteria.

16. The method of claim 15, wherein the set of path expansions comprises a set of collinear path expansions.

17. The method of claim 1, wherein the particular path expansion comprises a first shape and a previous path expansion comprises a second shape, wherein performing the viability check comprises determining whether the first shape of the particular path expansion is allowable based on the second shape of the previous path expansion.

18. The method of claim 1 further comprising specifying the particular route for the net of the design layout based on at least one particular path expansion that is specified for storage in the storage medium during the path search.

19. A method comprising:
  performing a path search that identifies a plurality of path expansions, said path search comprising:
  i. performing a viability check on a particular path expansion to ensure that a particular segment of a particular route that would result from the particular path expansion in a design layout satisfies a minimum length criteria by comparing a length of the particular path expansion with a minimum length requirement between at least one pair of segments, said minimum length requirement being stored in a pre-tabulated table, wherein performing the viability check on the particular path expansion further comprises determining whether a path expansion direction for the particular path expansion is allowable; and
  ii. specifying the particular path expansion for storage in a storage medium as a viable path expansion when the particular path expansion satisfies the viability check,
  wherein the path search that identifies the plurality of path expansions is successfully completed before the particular route for a net in the design layout is specified.

20. A method comprising:
  performing a path search that identifies a plurality of path expansions, said path search comprising:
  i. performing a viability check on a particular path expansion to ensure that a particular segment of a particular route that would result from the particular path expansion in a design layout satisfies a minimum length criteria by comparing a length of the particular path expansion with a minimum length requirement between a circuit geometry and a segment, said minimum length requirement being stored in a pre-tabulated table, wherein performing the viability check on the particular path expansion further comprises determining whether a path expansion direction for the particular path expansion is allowable; and ii. specifying the particular path expansion for storage in a storage medium as a viable path expansion when the particular path expansion satisfies the viability check, wherein the path search that identifies the plurality of path expansions is successfully completed before the particular route for a net in the design layout is specified.

21. A computer readable medium storing a computer program that is executable by at least one processor, the computer program comprising sets of instructions for:

specifying a route for a net in a design layout by performing a path search that identifies a plurality of path expansions, wherein performing the path search comprises performing a viability check on a particular path expansion to ensure that a particular segment of a particular route that would result from the particular path expansion in the design layout satisfies a minimum length criteria by comparing a length of the particular path expansion with a minimum length requirement between at least one pair of circuit geometries, said minimum length requirement being stored in a pre-tabulated table, wherein performing the viability check on the particular path expansion further comprises determining whether a path expansion direction for the particular path expansion is allowable, wherein the path search that identifies the plurality of path expansions is successfully completed before the route for the net in the design layout is specified; and defining the design layout based on the specified route, the design layout for use in manufacturing an integrated circuit.

22. The computer readable medium of claim 21, wherein the plurality of path expansions comprises first and second bends, wherein the set of instructions for performing the viability check comprises a set of instructions for computing a length of at least one set of path expansions between the first and second bends.

\* \* \* \* \*